US009664721B1

(12) United States Patent
Noras

(10) Patent No.: US 9,664,721 B1
(45) Date of Patent: May 30, 2017

(54) SOLID-STATE ELECTRIC-FIELD SENSOR

(71) Applicant: The University of North Carolina at Charlotte, Charlotte, NC (US)

(72) Inventor: Maciej Artur Noras, Concord, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 439 days.

(21) Appl. No.: 13/662,848

(22) Filed: Oct. 29, 2012

Related U.S. Application Data

(63) Continuation-in-part of application No. 13/528,185, filed on Jun. 20, 2012, now abandoned.

(60) Provisional application No. 61/499,393, filed on Jun. 21, 2011.

(51) Int. Cl.
*G01R 29/12* (2006.01)
*G01R 29/24* (2006.01)

(52) U.S. Cl.
CPC ............ *G01R 29/12* (2013.01); *G01R 29/24* (2013.01)

(58) Field of Classification Search
CPC ................................. G01R 29/24; G01R 29/12
See application file for complete search history.

(56) References Cited

U.S. PATENT DOCUMENTS

| 4,191,929 A * | 3/1980 | Max et al. ................... 330/10 |
| 5,256,974 A * | 10/1993 | Padden ................ G01R 29/12 324/457 |
| 5,315,232 A * | 5/1994 | Stewart ......................... 324/72 |
| 2005/0122118 A1* | 6/2005 | Zank ...................... G01D 9/005 324/457 |
| 2009/0240449 A1* | 9/2009 | Gibala et al. ................... 702/62 |

OTHER PUBLICATIONS

Cover, Contruction of a prototype MOS electrometer, Aug. 1989, AIP Rev. Sci. Instrument, vol. 60, No. 8, pp. 2733-2739.*
Noras et al., Evaluation of Surface Charge Density with Electrostatic Voltmeter-Measurement Geometry Considerations, 2008, IAS '08 IEEE, pp. 1-6.*
ter Haseborg et al., Detection of Projectiles by Electric Field Measurements, Nov. 1980, IEEE Trans. on Aerospace and Electronic Systems, vol. 16, No. 6, pp. 750-754.*

* cited by examiner

*Primary Examiner* — Melissa Koval
*Assistant Examiner* — Courtney McDonnough
(74) *Attorney, Agent, or Firm* — J. Clinton Wimbish; Smith Moore Leatherwood LLP

(57) ABSTRACT

An electric-field sensor is provided that includes a voltage-controlled capacitor and generator circuitry. The voltage-controlled capacitor is influenceable by an electric field created by a target located a distance from the solid-state electric-field sensor. The generator circuitry is configured to generate a modulated voltage for driving the voltage-controlled capacitor to produce a modulated capacitance as the voltage-controlled capacitor is influenced by the electric field to enable measurement of the electric field. In this regard, the voltage-controlled capacitor and generator circuitry are configured such that, in operation, an electric field of the target causes a change in the modulated capacitance and a current flow through the voltage-controlled capacitor. An electric potential of the target, then, is measurable as a function of the change in magnitude of the current flow through the voltage-controlled capacitor.

20 Claims, 5 Drawing Sheets

SOLID-STATE ELECTRIC-FIELD SENSOR

CROSS-REFERENCE TO RELATED APPLICATION(S)

The present application is a continuation-in-part of U.S. patent application Ser. No. 13/528,185, entitled: Solid State Electric Field Sensor, filed on Jun. 20, 2012, which claims priority to U.S. Provisional Patent Application No. 61/499,383, entitled: Solid State Electric Field Sensor, filed on Jun. 21, 2011; the contents of both of which are incorporated herein by reference in their entireties.

TECHNOLOGICAL FIELD

The present disclosure relates generally to a sensor for electric-field sensing and, in particular, to a solid-state sensor for electric-field sensing.

BACKGROUND

Over the years, numerous techniques for charge/electric field/voltage detection and measurements have been developed. One of the biggest challenges for designers of such instrumentation is to devise ways of preventing the exchange of the electric charges between the measured object and the meter. This is especially important for the objects under test for which the amount of charge is limited, and where the presence of the measuring instrument affects the physical state of that object. In such cases the input impedance of the meter has to be as high as possible, and one of the ways to achieve that is by avoiding any physical contact with the measured object.

Non-contacting instruments are widely available, but many have drawbacks. Meters such as those utilizing Kerr or Pockels effect, rotating vane fieldmeters, fieldmeters with mechanically actuated sensors or the like generally lack precision. Other meters such as electrostatic voltmeters (ESVMs), which also rely on mechanical excitation of the sensors (tuning fork or a precision piezoelectric or acoustic drive) are relatively expensive and complicated. Recently developed micro-electromechanical devices (MEMS) introduce a new class of miniature fieldmeters, but fabrication of field sensing MEMS appears to be a complicated and not easily-repeatable process. Other types of electric-field meters such as capacitive coupling or induction instruments rely on variation of the electric quantity that is being measured; and therefore, they are not useful for detection and quantification of static (DC) electric charges and fields.

BRIEF SUMMARY

Example implementations of the present disclosure are generally directed to an improved solid-state electric-field sensor that uses a voltage-controlled capacitor for non-contact measurement of AC or DC electric charges, fields or potentials. The sensor of example implementations may have a simple construction that may be easily miniaturized. The sensor's output reading may be scalable from a single volt or lower, to thousands of kilovolts per meter, and it may operate at frequencies over a wide frequency range from DC to 5 MHz or higher.

According to one aspect of example implementations, an electric-field sensor is provided that includes a voltage-controlled capacitor and generator circuitry. The voltage-controlled capacitor is influenceable by an electric field created by a target located a distance from the solid-state electric-field sensor. The generator circuitry is configured to generate a modulated voltage for driving the voltage-controlled capacitor to produce a modulated capacitance as voltage-controlled capacitor is influenced by the electric field. In this regard, the voltage-controlled capacitor and generator circuitry are configured such that, in operation, an electric field of the target causes a change in the modulated capacitance and a current flow through the voltage-controlled capacitor. An electric potential of the target, then, is measurable as a function of the change in magnitude of the current flow through the voltage-controlled capacitor.

In one example, the voltage-controlled capacitor may be a dual common cathode or anode varactor diode including a common junction exposed to the electric field. In this example, the solid-state electric-field sensor may further include a sensing element connected to the common junction of the dual common cathode/anode varactor diode. The sensing element may be capable of picking up the electric field of the target.

In one example, the generator circuitry may include a voltage source configured to generate a sinusoidal modulated voltage, and a 1:1 transformer through which the modulated voltage may be applied to the voltage-controlled capacitor. In this example, the current flow through the voltage-controlled capacitor may be measurable from a center tap of the transformer.

In another aspect of example implementations, a sensor platform is provided that includes a solid-state electric-field sensor similar to that described above, as well as a data recorder circuitry configured to receive a measurement from the solid-state electric-field sensor and provide the measurement to a data processing device. The data recorder circuitry may include a communications interface configured to support wireless communication with the data processing device. In one example, the sensor platform may further include power circuitry configured to supply power to the sensor platform. The power circuitry may include one or more batteries onboard the sensor platform. Additionally or alternatively, the power circuitry may include circuitry configured to harvest power from the target.

In yet another aspect of example implementations, a method is provided that includes disposing a solid-state electric-field sensor a distance from a target, and driving the sensor's voltage-controlled capacitor with a modulated voltage to produce a modulated capacitance. The method also includes measuring an electric field created by the target with the voltage-controlled capacitor as the voltage-controlled capacitor is driven to produce the modulated capacitance. In this regard, an electric field of the target causes a change in the modulated capacitance and a current flow through the voltage-controlled capacitor. And an electric potential of the target is measured as a function of the change in magnitude of the current flow through the voltage-controlled capacitor.

In one example, the solid-state electric-field sensor may be disposed a distance from the target comprising a power line. In this example, the solid-state electric-field sensor may be part of a sensor platform that may further include power circuitry configured to supply power to the sensor platform. Also in this example, the power circuitry may include circuitry configured to harvest power from the power line.

In one example, the solid-state electric-field sensor may be disposed in proximity of an expected trajectory of the target comprising a projectile, and the method may further include detecting the projectile and determining its velocity from the measured electric potential of the target. In a further example, the solid-state electric-field sensor may include an array of solid-state electric-field sensors each of which includes a respective voltage-controlled capacitor. The solid-state electric-field sensors may be driven and may measure the electric field to obtain respective measurements of the electric potential of the target. The method may then further include determining a trajectory of the projectile from the measurements of the electric potential of the target.

The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

DETAILED DESCRIPTION

Figure 1:
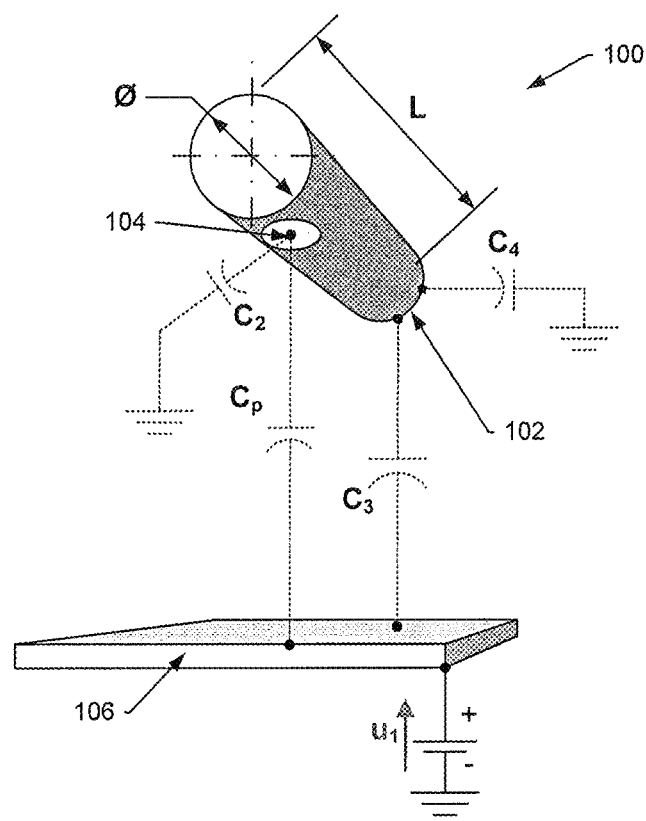
FIG. 1 illustrates a typical electrostatic voltmeter (ESVM) probe.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. Like reference numerals refer to like elements throughout.

The terminology used herein is for the purpose of describing particular implementations only and is not intended to be limiting of the present disclosure. As used herein, the term "and/or" includes any and all combinations of one or more of the associated listed items. As used herein, the singular forms "a," "an" and "the" are intended to include the plural forms as well as the singular forms, unless the context clearly indicates otherwise. It will be further understood that the terms "comprises" and/or "comprising," when used in this disclosure, specify the presence of stated features, steps, operations, elements and/or components, but do not preclude the presence or addition of one or more other features, steps, operations, elements, components and/or groups thereof.

Unless otherwise defined, all terms (including technical and scientific terms) used herein have the same meaning as commonly understood by one having ordinary skill in the art to which the present disclosure belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing example implementations of the present disclosure, it will be understood that a number of techniques and steps are disclosed. Each of these has individual benefit and each may also be used in conjunction with one or more, or in some cases all, of the other disclosed techniques. Accordingly, for the sake of clarity, this description will refrain from repeating every possible combination of the individual steps in an unnecessary fashion. Nevertheless, the description should be read with the understanding that such combinations are entirely within the scope of the invention and the claims.

Example implementations of the present disclosure relate generally to an electric-field sensor that uses a voltage-controlled capacitor for non-contact measurement of AC or DC electric charges, fields or potentials. The sensor may have any of a number of different applications. Examples of suitable applications include power-line monitoring, projectile detection, failure detection (including high-impedance fault detection), electroencephalography (EEG) monitoring, earthquake prediction or the like. It should be understood, however, that the sensor may have other applications.

Non-contacting electric potential (voltage) measurements by suitable meters are very frequently used in many industries including the semiconductor and electro-photography industries. Lack of contact assures that the meter will not alter the physical state of the measured object. The meters operating in non-contacting mode may use already-introduced Kerr or Pockel's effects, but these methods do not provide very accurate measurements down to the millivolt level. The technique that is most frequently used relies on the Kelvin probe principle introduced in 19th century. Since that time, many improvements and modifications have been introduced to the original Kelvin's construction, leading to development of more accurate and easier to use devices. The principle of operation of the Kelvin probe has its origin in the very basic equation defining capacitance C of a capacitor:

$$C = Q/U \qquad (1)$$

where Q represents the electric charge accumulated by the capacitor, and U represents the electric potential (voltage) between electrodes of the capacitor. Any change of the distance between electrodes during the time interval dt may require a certain amount of electric charge dQ to be delivered to or taken away from the capacitor in order for the voltage U to remain constant:

$$dQ/dt = dC/dt \cdot U \qquad (2)$$

Since dQ/dt represents an electric current, measurement of that current may allow for measurement of the voltage if the capacitance variation is known. In fieldmeters and electrostatic voltmeters, the capacitance may be formed by the instrument's sensor and the object being measured. In 1932, Zisman introduced a mechanically vibrating Kelvin probe in which the sensor moved sinusoidally in the direction perpendicular to the tested object; and the current flowing to and from the sensor changed proportionally to the amplitude and frequency of that vibration. This technique became a basis for contemporary Kelvin probe techniques, including Kelvin force microscopes (KFMs), fieldmeters and electrostatic voltmeters. Notably, however, the mechanical vibration of the sensor needs to be precisely controlled to assure proper measurement accuracy of the meter.

Fieldmeters with mechanically vibrating sensors and rotating-vane fieldmeters are used in a broad range of applications, such as in semiconductor and other industries for assessment of the electrostatic discharge (ESD) threats, atmospheric research and the like. But fieldmeters are not very sensitive, and their bandwidth is limited by the velocity of the rotating vane or the vibration frequency of the sensor, with the maximum reaching about 20 Hz. The fieldmeter's technical capabilities are not sufficient for many applications. Electrostatic voltmeters (ESVM) are much more sensitive and precise than fieldmeters with the bandwidth of up to 3 kHz. But their construction is relatively expensive and complicated, as it includes a high precision mechanical drive to generate controlled sensor displacement and very often also contains a high voltage generator allowing for measurements of correspondingly high potentials. Other types of electric-field meters, such as the optoelectrical instruments work well in near-field applications, but are not feasible for far-field detection (near and far pertaining to distance of sensing in relation to sensor size).

Figure 2:
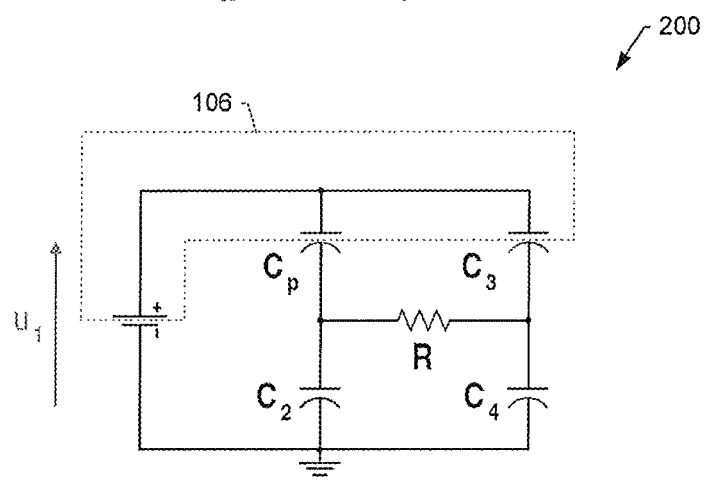
FIG. 2 illustrates a circuit that corresponds to the ESVM probe of FIG. 1.

FIG. 1 illustrates a typical electrostatic voltmeter (ESVM) probe 100 with a round, cylindrical body 102 and a circular sensor 104, and FIG. 2 illustrates the corresponding circuit 200. The probe is suspended above the conductive surface under test 106. The body and sensor are capacitively coupled to the surface under test and to the surrounding. In FIG. 1, $C_p$ represents a capacitance between the surface under test and the sensor, $C_2$ represents a capacitance between the sensor and the earth ground, $C_3$ represents a capacitance between the probe body (e.g., probe enclosure) and the surface under test, and $C_4$ represents a capacitance between the probe body and the earth ground. In FIG. 2, R represents a resistor on which current through the sensor is detected, and $u_1$ represents a voltage on the surface under test. The sensor is conventionally a mechanically vibrating sensor, which results in mechanical modulation of capacitance $C_p$. But as explained above, this arrangement has drawbacks.

Figure 3:
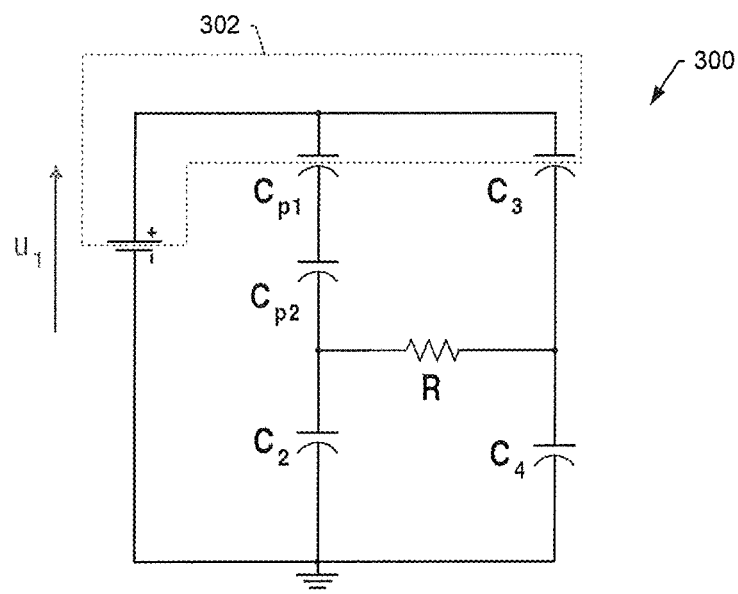
FIG. 3 illustrates a circuit that illustrates principles that may be implemented by a solid-state sensor according to examples of the present disclosure.

FIG. 3 illustrates a circuit 300 that illustrates principles that may be implemented by a solid-state sensor according to examples of the present disclosure. The circuit of FIG. 3 may be similar to the circuit of FIG. 2 and include a surface under test 302, but the circuit of FIG. 3 divides the capacitance of the sensor to the plate $C_p$ into two capacitances, namely, $C_{p1}$ and $C_{p1}$ connected in series. In this regard, $C_p$ may be related to $C_{p1}$ and $C_{p2}$ as follows:

$$C_p = \frac{C_{p2} \cdot C_{p1}}{C_{p2} + C_{p1}} \quad (3)$$

Capacitance $C_{p1}$ depends on the geometry of the sensor and surface-under-test configuration, and on the dielectric permittivity of a medium between the sensor and tested surface. Under these conditions $C_{p1}$ has a fixed, constant value. Capacitance $C_{p2}$ is a variable capacitance, changing with time. This variable capacitance $C_{p2}$ may be implemented with a voltage-controlled capacitor. Examples of suitable devices that may be used to implement a voltage-controlled capacitor include a varactor diode (also known as a varicap diode), a metal-oxide-semiconductor (MOS) capacitor, metal-insulator-semiconductor (MIS) capacitor or the like.

Figure 4:
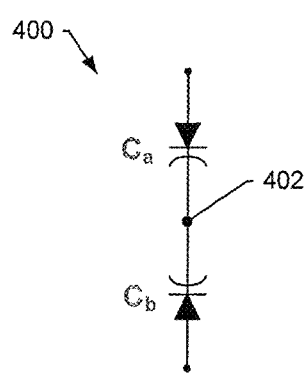
FIG. 4 illustrates one example of a voltage-controlled capacitor according to examples of the present disclosure.

As shown in FIG. 4, in one example, the voltage-controlled capacitor may be implemented by a dual common cathode or anode varactor diode 400 (sometimes referred to as a dual varactor or varactor couple). In this example, the dual varactor may include a pair of matched varactor diodes (diodes a and b) electrically connected by their cathodes/anodes at a common junction (node) 402. The voltage-capacitance characteristics of matched varactor diodes may be considered identical or nearly identical. Consequently, for any bias voltage u(t), the capacitances of varactor diodes may be the same or nearly the same, i.e., $C_a(u(t)) \approx C_b(u(t))$. Assume for example that the voltage-capacitance dependence of the matched pair of varactor diodes is linear or nearly linear (within a certain range).

Returning to FIG. 3, in one example, $C_{p2}$ may change sinusoidally with time in instances in which the voltage-controlled capacitor is modulated by a sinusoidal voltage source. Hence:

$$C_{p2} = C_{p20} + C_{p21} \cdot \sin(\omega t) \quad (4)$$

where $C_{p20}$ represents a constant portion of the capacitance $C_{p2}$, $C_{p21}$ represents the amplitude of a variable portion of the capacitance $C_{p2}$, and co represents the modulation frequency. The voltage $u_{Cp2}$ across the capacitance $C_{p2}$ may relate to the capacitance, and more particularly its variable portion $C_{p21}$ by the capacitance-voltage characteristic of the varactor diode 400, and may be a nonlinear, logarithmic curve, different for different types of varactor diodes.

The voltage $u_{Cp2}$ across the capacitance $C_{p2}$ may depend on the voltage $u_1$. In instances in which $u_1$ has a constant value, $u_{Cp2}$ is also constant. The modulated capacitance $C_{p2}$ may function as a current source, whose current i may be represented as follows:

$$i = \frac{dC_{p2}}{dt} \cdot u_{Cp2} + \frac{du_{Cp2}}{dt} \cdot C_{p2} \quad (5)$$

Since, $$u_{Cp2} = \text{const} \Rightarrow i = \frac{dC_{p2}}{dt} \cdot u_{Cp2} \quad (6)$$

Combining equations (4) and (6) may yield the following representation of the current:

$$i = u_{Cp2} C_{P21} \cdot \omega \cdot \cos(\omega t) \quad (7)$$

By detecting and measuring current i, the potential $u_{Cp2}$ may be determined, and from $u_{Cp2}$, the potential $u_1$ may also be measured.

Figure 5:
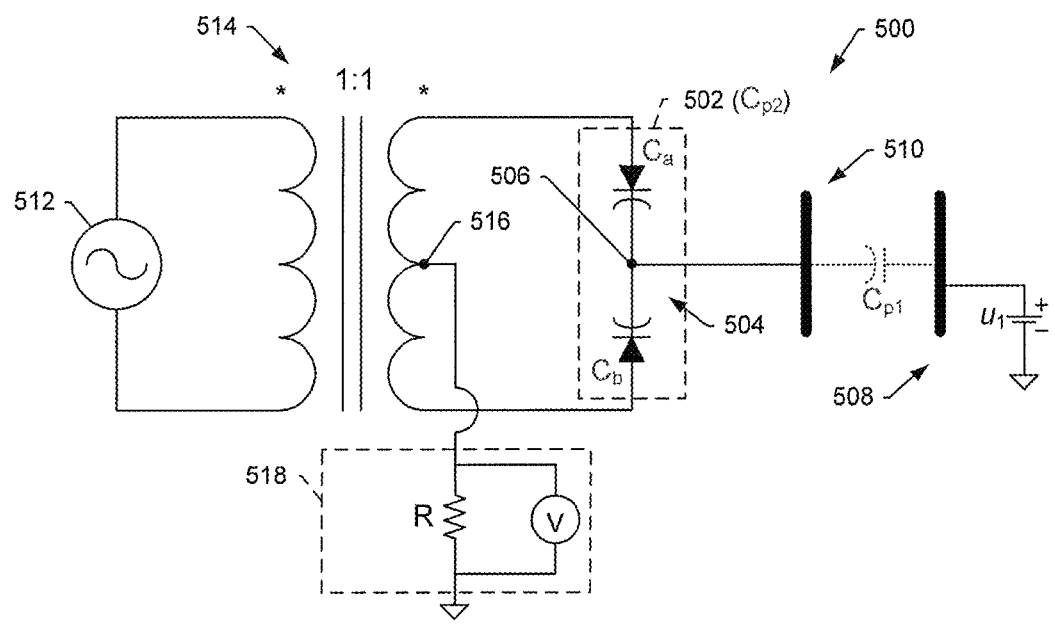
FIG. 5 illustrates a solid-state sensor according to examples of the present disclosure.

FIG. 5 illustrates a solid-state sensor 500 configured to implement principles of the circuit 300 of FIG. 3. As shown, the sensor includes a number of solid-state circuit components, but it should be understood that the sensor may also include one or more other circuit components in various example implementations. In this regard, the sensor may include other circuit component(s) to more specifically adapt the sensor for various applications.

As shown in FIG. 5, the solid-state sensor 500 includes a voltage-controlled capacitor 502. As shown, the voltage-controlled capacitor may be implemented by a dual common cathode or anode varactor diode 504, which may include a pair of matched varactor diodes electrically connected by their cathodes/anodes at a common junction (node) 506. The voltage-controlled capacitor generally, and common junction of the capacitor more particularly, may function as an electric-field sensor exposed to and influenceable by an electric field created by a target 508 to enable measurement of the electric field.

The voltage-controlled capacitor 502 may be connected to a sensing element 510, such as by the common junction 506, for picking up or otherwise detecting the electric field created by the target 508. The sensing element may be any of a number of different solid-state devices capable of picking up an electric field created by the target 508 that is located a distance from the sensing element, and that possess an electric charge and has an electric potential $u_1$ referenced to ground. Examples of suitable sensing elements include any of a number of different conductive surfaces, plates, electrodes, antennas or the like. The voltage-controlled capacitor 502 and sensing element may be directly connected to one another, or they may be connected via one or more circuit components therebetween. In instances in which a desired frequency range of the target is known, for example, the voltage-controlled capacitor and sensing element may be connected via circuit component(s) such as one or more filters configured to distinguish the desired signal from background electromagnetic noise. Additionally or alternatively, the sensing element may itself be designed to facilitate distinction between the desired signal and background electromagnetic noise.

In operation, the sensing element 510 may capacitively couple to the target 508. In FIG. 5, $C_{p1}$ represents the capacitance between the sensing element and target, which may have a fixed, constant value. The voltage-controlled capacitor, on the other hand, may have a variable capacitance $C_{p2}$. This variable capacitance may relate to the varactor diode capacitances $C_a$, $C_b$ as follows:

$$C_{p2} = \frac{C_a \cdot C_b}{C_a + C_b} \quad (8)$$

As also shown in FIG. 5, the sensor 500 may include generator circuitry configured to generate a modulated voltage at frequency ω with which the voltage-controlled capacitor 502 may be driven. As shown, for example, the generator circuitry may include a voltage source 512 configured to generate a sinusoidal modulated voltage, which may be applied to the voltage-controlled capacitor, directly or through intervening circuitry such as a 1:1 transformer 514. The magnitude and frequency of the modulated voltage may be set in any of a number of different manners, such as according to the particular application of the sensor. In this regard, the magnitude may be set to correspondingly set the sensitivity of the sensor. In one example, the voltage source may be configured to generate a 10 Vpp voltage at 1 MHz. In another example, the voltage source may be configured to generate a 0.2-1 Vpp voltage at 10 MHz.

An AC or DC electric field of the target 508 in proximity of the voltage-controlled capacitor 502, or more particularly the sensing element 510 connected thereto, may cause a change in the modulated capacitance and a current flow i through the voltage-controlled capacitor. In this regard, the change in the modulated capacitance may in turn cause a measurable change in the magnitude of the modulated voltage from the voltage source 512, and an electric potential of the target may be measurable as a function of the change in magnitude of the modulated voltage. In one example, the change in magnitude of the modulated voltage may be measured as change in the value of a current i flowing through a center tap 516 of the transformer 514, and may be measured via appropriate circuitry 518.

According to the principles set forth above with respect to FIG. 3, the potential $u_1$ may be measured or otherwise determined as a function of i. In this regard, because of the relationship between $u_{Cp2}$ and $C_{p21}$, the relationship between $u_1$ and $C_{p21}$ may be determined experimentally (tuned) for a particular type of varactor diode 504. The relationship between $u_{Cp2}$ and $u_1$ may depend on the amount of the electric potential picked up by the sensing element 510, which may depend on the distance between the sensor 500 and the target 508, and the surface area of the sensor. This may also be determined experimentally as this induced voltage may depend strongly on capacitive coupling of the sensing element to other objects in the surrounding (which are not necessarily the objects that one desires to measure).

The appropriate circuitry 518 may include any of a number of different circuit components. As shown in FIG. 5, for example, the current i change through the center tap 516 of the transformer 514 may be measured as a voltage drop across a resistor R. Examples of other suitable components of the appropriate circuitry may include amplifier circuitry, demodulator circuitry or the like.

Figure 6:
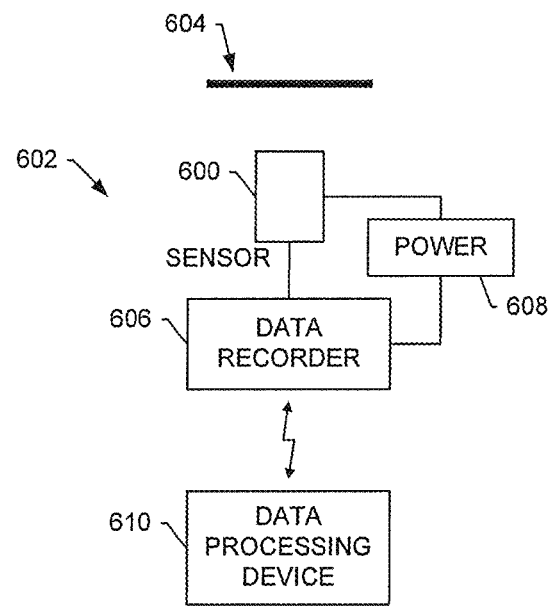
FIG. 6 illustrates a sensor platform including a sensor according to examples of the present disclosure.

As explained above, the sensor of example implementations of the present disclosure may have any of a number of different applications. FIG. 6 illustrates a sensor platform 600 including a sensor 602 that may be disposed a distance from a target 604 to measure AC or DC electric charges, fields or potentials possessed or created by the target. In various examples, the sensor may be configured to provide real-time or near-real-time information about the target. In one example, the sensor 602 may correspond to the sensor 500 of FIG. 5, and the target 604 may correspond to the target 508 of FIG. 5.

The target 604 may include any of a number of different objects that possess an electric charge and has an electric potential $u_1$ referenced to ground, and may depend on application of the sensor 602. The target may be stationary or in motion. In the context of power-line monitoring, for example, the target may be an insulated, non-insulated, shielded or unshielded cable, wire or the like. In the context of projectile detection, the target may be an object projected through space such as an arrow, dart, pellet, bullet, missile or the like.

As shown, the sensor platform 600 may include the sensor 602 as well as data recorder circuitry 606 and power circuitry 608. The data recorder circuitry may include any of a number of different components for receiving measurements from the sensor 600 and providing the measurements or representations of the measurements to a data processing device 610, which may be located onboard or external to the sensor platform 604. The data recorder circuitry may include a suitable hardware processor and memory. The data recorder may also include a communications interface for communication with the data processing device. The communications interface may support wired and/or wireless communication with the data processing device. In various examples, the communications interface may be configured to operate in accordance with one or more of a number of different wireless communication technologies, such as 3G, 3.9G, 4G, Wi-Fi, WiMAX, Bluetooth, IrDA, UWB, ZigBee or the like.

The power circuitry 608 may include any of a number of different components configured to supply power to the sensor platform (including the sensor and data recorder circuitry). In one example, the power circuitry may include one or more batteries onboard the sensor platform. In other examples, the power circuitry may include circuitry capable of harvesting power from the target 604, such as in the case of a power line. In various examples, this may include harvesting power from the magnetic field around the power line such as using a current transformer, or harvesting power from the electric field created by energized parts of the power line such as using a capacitively-coupled electrode. In yet other examples, the power circuitry may operate according to techniques such as photovoltaic, vibration, thermoelectric, airflow or the like.

In various examples, the sensor platform 604 may provide an integrated sensor configured to monitor more than electric charge, field or potential (voltage). In the context of power-line monitoring, for example, integrated sensor may include the sensor 600 for measuring an electric charge, field or potential (voltage) possessed or created by the power line 602. In addition, the integrated sensor may include another sensor for measuring current (AC or DC) through the power line. The current sensor may be capable of contact or non-contact measurement of current in any of a number of different manners. Examples of suitable current sensors include a current-transformer sensor, Hall-effect sensor or the like.

Figure 7:
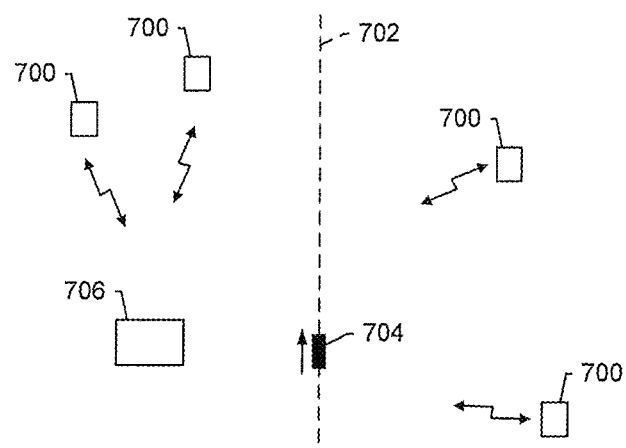
FIG. 7 illustrates one example application of a sensor in the context of projectile detection according to examples of the present disclosure.

FIG. 7 illustrates one example application in the context of projectile detection in which one or more sensor platforms 700 may be disposed in proximity of an expected trajectory 702 of a projectile 704; and therefore, for at least a period of time, disposed in proximity of the projectile. In various examples, as the projectile moves in proximity of the sensor platform(s), the sensor platform(s) may be configured to measure the projectile's electric charge, field or potential (voltage), and provide the measurements to a data processing device 706.

The data processing device 706 may be onboard one of the sensor platform(s) 700 or external to all of the sensor platforms, and may be configured to receive and from the measurements detect the projectile. The data processing device may be configured to detect the projectile and determine its velocity from measurements of a single sensor platform, but may be further configured to determine the projectile's source location and/or trajectory from measurements of an array of sensor platforms. In one example, each of the sensor platform(s) 700 may correspond to the sensor platform 602 of FIG. 6, the projectile 704 may correspond to the target 604 of FIG. 6, and the data processing device 706 may correspond to the data processing device 610 of FIG. 6.

The data processing device 706 may be configured to detect the projectile 704 and determine its source location and/or trajectory in any of a number of different manners. In one example, the sensor platforms 700 may be positioned so that their measurements are taken at different angles from the projectile. This may in turn enable the data processing device to triangulate the projectile's velocity, source location and/or trajectory from the measurements.

Figure 8:
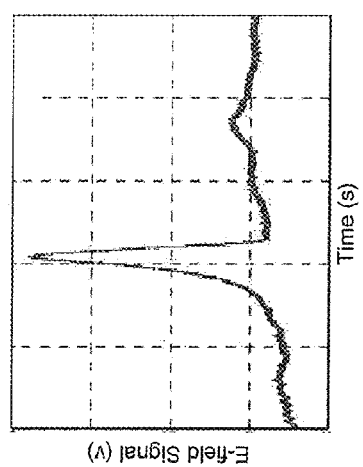
FIG. 8 illustrates a waveform of electric potential (voltage) that one example sensor platform may be expected to measure.

In one example, the data processing device 706 may be configured to triangulate the projectile 704 based on a magnitude versus elapsed time analysis. FIG. 8 illustrates a waveform of electric potential (voltage) that one example sensor platform 700 may be expected to measure. As shown, the waveform has a relatively-large magnitude peak, which may be interpreted as detection of a projectile in proximity of the respective sensor. In one example, this waveform signature may be used as a basis from which the data processing device may triangulate the projectile.

Figure 9:
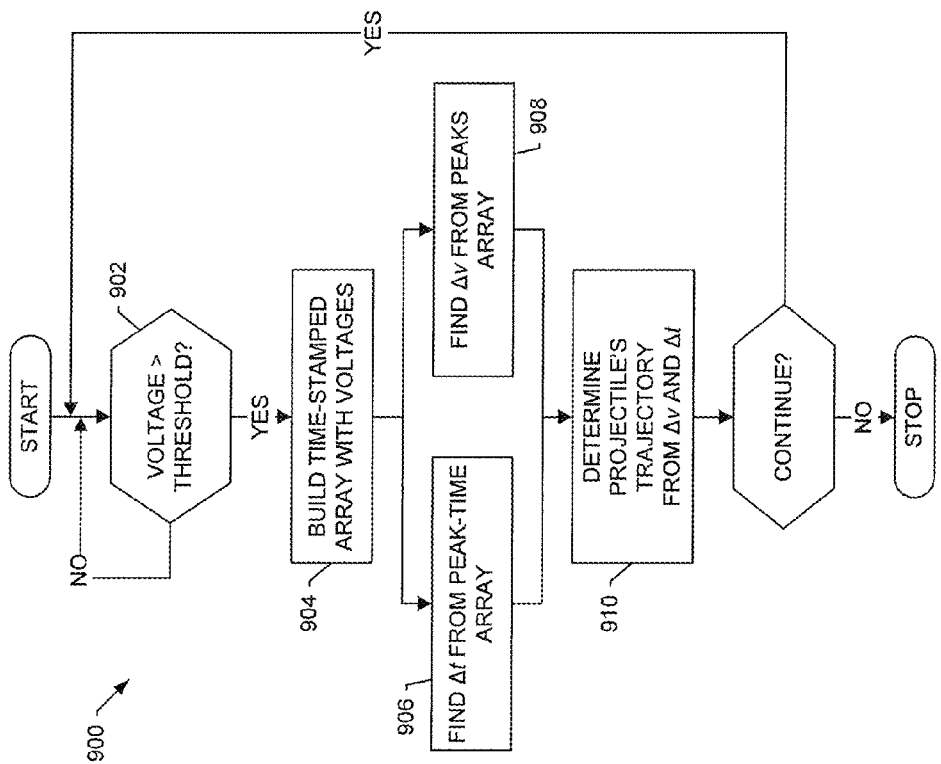
FIG. 9 illustrates a flowchart of a method including a number of operations that may be performed by a data processing device according to examples of the present disclosure.

FIG. 9 illustrates an example flowchart of a method 900 including a number of operations that may be performed by the data processing device 706 to process measurements of a sensor platform 700. The data processing device may receive electric potential (voltage) measurements from the sensor platforms, and may identify peaks in the measurements. As shown in block 902, for example, the data processing device may identify peaks as including voltages that exceed a threshold voltage, which may be chosen to be significantly different from a baseline value and ensure distinction between a detected projectile and background noise.

Once the data processing device 706 identifies a voltage exceeding the threshold, the data processing device may build a two-dimensional array of continuous sample values, as shown in block 904. The first column of the array may include time stamps taken at incremental time intervals (e.g., milliseconds), while the second column may include the magnitude values (e.g., millivolts) of the waveform above the threshold. In one example, each column of the two-dimensional array may itself be a one-dimensional array. The first column, then, may be referred to as a peak-time array, and the second column may be referred to as a peaks array.

After the peak magnitude has passed (the voltage decreases below the threshold), the data processing device 706 may post process the peak-time and peaks arrays. As shown in block 906, the time during which the peak occurred ($\Delta t$) may be determined from the peak-time array, such as by finding the difference between the largest and smallest time-stamp values. Similarly, a change in the peak voltage ($\Delta v$) may be determined from the peaks array, such as by finding the difference between the largest and smallest voltage values, as shown in block 908. The data processing device may then be configured to determine the projectile's velocity and proximity to the sensor platform 700 based on the $\Delta t$ and $\Delta v$ values. The data processing device may repeat the operations for other sensor platforms of an array, and from the values determined from their measurements, determine the projectile's source location and/or trajectory, as shown in block 912.

According to example embodiments of the present disclosure, the data recorder circuitry 606 and data processing device 610 may be implemented by various means. Means for implementing the respective elements may include hardware, alone or under direction of one or more computer program code instructions, program instructions or executable computer-readable program code instructions (generally "computer programs," e.g., software, firmware, etc.) from a computer-readable storage medium. In one example, one or more apparatuses may be provided that are configured to function as or otherwise implement the data recorder and data processing device shown and described herein. In examples involving more than one apparatus, the respective apparatuses may be connected to or otherwise in communication with one another in a number of different manners, such as directly or indirectly via a wire or wireless network or the like.

Generally, an apparatus of example implementations of the present disclosure may include one or more of each of a number of components such as, for example, a processor connected to a memory (computer-readable storage medium). The processor is generally any piece of hardware that is capable of processing information with or without the aid of a computer program. The processor may be a number of processors, a multi-processor core or some other type of processor, depending on the particular implementation. In other examples, the processor may be embodied as or otherwise include one or more application-specific integrated circuits (ASICs), field-programmable gate arrays (FPGAs) or the like.

The memory is generally any piece of hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive or some combination of the above. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface and/or one or more user interfaces. The communications interface may be configured to transmit and/or receive information by physical (wire) and/or wireless communications links. The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen) or the like.

Many modifications and other implementations of the disclosure set forth herein will come to mind to one skilled in the art to which this disclosure pertains having the benefit of the teachings presented in the foregoing description and the associated drawings. For example, example implementations of the present disclosure set forth herein may be used in lieu of or in addition to other image processing techniques such as super-resolution, post-processing image enhancement or the like. Therefore, it is to be understood that the disclosure not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A solid-state electric-field sensor comprising:
   a voltage-controlled capacitor influenceable by an electric field created by a target located a distance from the solid-state electric-field sensor; and
   generator circuitry configured to generate a modulated voltage for driving the voltage-controlled capacitor to produce a modulated capacitance as the voltage-controlled capacitor is influenced by the electric field to enable measurement of the electric field;
   wherein the voltage-controlled capacitor and generator circuitry are configured such that, in operation, an electric field of the target causes a change in the modulated capacitance and a current flow through the voltage-controlled capacitor, an electric potential of the target being measurable as a function of the change in magnitude of the current flow through the voltage-controlled capacitor.

2. The solid-state electric-field sensor of claim 1, wherein the voltage-controlled capacitor comprises a dual common cathode or anode varactor diode including a common junction exposed to the electric field.

3. The solid-state electric-field sensor of claim 2 further comprising a sensing element connected to the common junction of the dual common cathode or anode varactor diode, the sensing element being capable of picking up the electric field of the target.

4. The solid-state electric-field sensor of claim 1, wherein the generator circuitry comprises:
   a voltage source configured to generate a sinusoidal modulated voltage; and
   a 1:1 transformer through which the modulated voltage is applied to the voltage-controlled capacitor.

5. The solid-state electric-field sensor of claim 4, wherein the current flow through the voltage-controlled capacitor is measurable from a center tap of the transformer.

6. A sensor platform comprising:
   a solid-state electric-field sensor comprising a voltage-controlled capacitor influenceable by an electric field created by a target located a distance from the sensor, and drivable with a modulated voltage to produce a modulated capacitance as the voltage-controlled capacitor is influenced by the electric field to enable measurement of the electric field,
   wherein the voltage-controlled capacitor is configured such that, in operation, an electric field of the target causes a change in the modulated capacitance and a current flow through the voltage-controlled capacitor, an electric potential of the target being measurable as a function of the change in magnitude of the current flow through the voltage-controlled capacitor; and
   a data recorder circuitry configured to receive a measurement from the solid-state electric-field sensor and provide the measurement to a data processing device.

7. The sensor platform of claim 6, wherein the data recorder circuitry includes a communications interface configured to support wireless communication with the data processing device.

8. The sensor platform of claim 6 further comprising:
   power circuitry configured to supply power to the sensor platform, the power circuitry including one or more batteries onboard the sensor platform.

9. The sensor platform of claim 6 further comprising:
power circuitry configured to supply power to the sensor platform, the power circuitry including circuitry configured to harvest power from the target.

10. The sensor platform of claim 6, wherein the voltage-controlled capacitor comprises a dual common cathode or anode varactor diode including a common junction exposed to the electric field.

11. The sensor platform of claim 10 further comprising a sensing element connected to the common junction of the dual common cathode or anode varactor diode, the sensing element being capable of picking up the electric field of the target.

12. The sensor platform of claim 6, wherein the solid-state electric-field sensor further comprises generator circuitry configured to generate the modulated voltage for driving the voltage-controlled capacitor.

13. The sensor platform of claim 12, wherein the generator circuitry comprises:
a voltage source configured to generate a sinusoidal modulated voltage; and
a 1:1 transformer through which the modulated voltage is applied to the voltage-controlled capacitor.

14. The sensor platform of claim 13, wherein the current flow through the voltage-controlled capacitor is measurable from a center tap of the transformer.

15. A method comprising:
disposing a solid-state electric-field sensor a distance from a target, the solid-state electric-field sensor comprising a voltage-controlled capacitor;
driving the voltage-controlled capacitor with a modulated voltage to produce a modulated capacitance;
measuring an electric field created by the target with the voltage-controlled capacitor as the voltage-controlled capacitor is driven to produce the modulated capacitance, an electric field of the target causing a change in the modulated capacitance and a current flow through the voltage-controlled capacitor, an electric potential of the target being measured as a function of the change in magnitude of the current flow through the voltage-controlled capacitor.

16. The method of claim 15, wherein the solid-state electric-field sensor is disposing a distance from the target comprising a power line.

17. The method of claim 16, wherein disposing the solid-state electric-field sensor includes disposing a sensor platform including solid-state electric-field sensor, and further including power circuitry configured to supply power to the sensor platform, the power circuitry including circuitry configured to harvest power from the power line.

18. The method of claim 15, wherein the solid-state electric-field sensor is disposed in proximity of an expected trajectory of the target comprising a projectile, and
wherein the method further comprises detecting the projectile and determining its velocity from the measured electric potential of the target.

19. The method of claim 18, wherein the solid-state electric-field sensor comprises an array of solid-state electric-field sensors each of which includes a respective voltage-controlled capacitor,
wherein driving the voltage-controlled capacitor and measuring the electric field occur for the solid-state electric-field sensors to obtain respective measurements of the electric potential of the target, and
wherein the method further comprises determining a trajectory of the projectile from the measurements of the electric potential of the target.

20. The method of claim 15, wherein the voltage-controlled capacitor comprises a dual common cathode or anode varactor diode including a common junction exposed to the electric field.

* * * * *